(12) United States Patent
Lavi et al.

(10) Patent No.: US 8,888,328 B2
(45) Date of Patent: Nov. 18, 2014

(54) LIGHT ENGINE

(71) Applicant: Orbotech Ltd., Yavne (IL)

(72) Inventors: Ben-Zion Lavi, Rehovot (IL); Ram Oron, Nes Ziona (IL); Uri Gold, Rishon Le'Zion (IL); Ilia Lutsker, Kfar Saba (IL); Mordechay Silberberg, Oranit (IL)

(73) Assignee: Orbotech Ltd., Yavne (IL)

( * ) Notice: Subject to any disclaimer, the term of this patent is extended or adjusted under 35 U.S.C. 154(b) by 184 days.

(21) Appl. No.: 13/712,580

(22) Filed: Dec. 12, 2012

(65) Prior Publication Data

US 2014/0160757 A1    Jun. 12, 2014

(51) Int. Cl.
*F21V 29/00* (2006.01)

(52) U.S. Cl.
CPC .................................... *F21V 29/002* (2013.01)
USPC .......................................... 362/294; 362/218

(58) Field of Classification Search
USPC .............................. 362/294, 218, 227, 249.02
See application file for complete search history.

(56) References Cited

U.S. PATENT DOCUMENTS

| | | | | |
|---|---|---|---|---|
| 5,144,149 | A * | 9/1992 | Frosch | 250/493.1 |
| 8,378,322 | B2 * | 2/2013 | Dahm et al. | 250/496.1 |
| 2004/0114355 | A1 | 6/2004 | Rizkin et al. | |
| 2004/0145703 | A1 | 7/2004 | O'Connor et al. | |
| 2005/0263680 | A1 | 12/2005 | Stein et al. | |
| 2007/0058366 | A1 | 3/2007 | West | |
| 2007/0187815 | A1 | 8/2007 | Dai et al. | |
| 2009/0010009 | A1 | 1/2009 | Yang et al. | |
| 2009/0010010 | A1 | 1/2009 | Chang et al. | |
| 2009/0140278 | A1 | 6/2009 | Koyama et al. | |
| 2010/0085730 | A1 | 4/2010 | Chen et al. | |
| 2010/0170670 | A1 | 7/2010 | Catalano | |
| 2011/0080742 | A1 | 4/2011 | Allen et al. | |
| 2012/0182484 | A1 | 7/2012 | Imai et al. | |

FOREIGN PATENT DOCUMENTS

| | | |
|---|---|---|
| CN | 2723833 Y | 9/2005 |
| CN | 1680749 A | 10/2005 |
| CN | 1722477 A | 1/2006 |
| CN | 1854884 A | 11/2006 |
| CN | 101093074 A | 12/2007 |
| CN | 101179892 A | 5/2008 |
| CN | 201066112 Y | 5/2008 |
| CN | 201078679 Y | 6/2008 |
| CN | 201078680 Y | 6/2008 |
| CN | 201078681 Y | 6/2008 |
| CN | 101329040 A | 12/2008 |
| CN | 201180966 Y | 1/2009 |
| CN | 201187755 Y | 1/2009 |
| CN | 201199017 Y | 2/2009 |
| CN | 201204203 Y | 3/2009 |
| CN | 101463956 A | 6/2009 |

(Continued)

OTHER PUBLICATIONS

Rudiger Herrmann et al., "Liquid Cooled LED Arrays as Bright as 30 Headlights", EE Times Europe Magazine, Mar. 2012, pp. 1-3.

*Primary Examiner* — Vip Patel
(74) *Attorney, Agent, or Firm* — Sughrue Mion, PLLC

(57) ABSTRACT

An LED-based high power uniform light engine including an array of LEDs having a common anode and a fill factor which exceeds 0.85, the common anode having heat spreading functionality and an active heat sink which is thermally connected to the common anode.

21 Claims, 2 Drawing Sheets

(56) References Cited

FOREIGN PATENT DOCUMENTS

| | | | |
|---|---|---|---|
| CN | 101619845 A | 1/2010 |
| CN | 101714750 A | 5/2010 |
| CN | 201496824 U | 6/2010 |
| CN | 201535991 U | 7/2010 |
| CN | 101795516 A | 8/2010 |
| CN | 101865439 A | 10/2010 |
| CN | 101868087 A | 10/2010 |
| CN | 201599767 U | 10/2010 |
| CN | 201636811 U | 11/2010 |
| CN | 101922629 A | 12/2010 |
| CN | 101994918 A | 3/2011 |
| CN | 102003695 A | 4/2011 |
| CN | 102032513 A | 4/2011 |
| CN | 201830493 U | 5/2011 |
| CN | 102095173 A | 6/2011 |
| CN | 201851943 U | 6/2011 |
| CN | 102175428 A | 9/2011 |
| CN | 102176805 A | 9/2011 |
| DE | 20 2010 000 350 U1 | 6/2010 |
| EP | 2 315 285 A1 | 4/2011 |
| FR | 2 930 814 A1 | 11/2009 |
| GB | 2 395 074 A | 5/2004 |
| GB | 2469551 A | 10/2010 |
| JP | 2011-009248 A | 1/2011 |
| JP | 2011-009251 A | 1/2011 |
| JP | 2011-009254 A | 1/2011 |
| KR | 10-2006-0081902 A | 7/2006 |
| KR | 10-0704669 B1 | 4/2007 |
| KR | 10-2009-0024876 A | 3/2009 |
| KR | 10-2009-0053767 A | 5/2009 |
| KR | 10-0947170 B1 | 3/2010 |
| KR | 10-2010-0041367 A | 4/2010 |
| KR | 10-2010-0121973 A | 11/2010 |
| KR | 10-2011-0076408 A | 7/2011 |
| TW | 319172 U | 9/2007 |
| TW | 200928215 A | 7/2009 |
| TW | 200928216 A | 7/2009 |
| TW | 201044653 A | 12/2010 |
| WO | 02/097325 A1 | 12/2002 |
| WO | 2004/086822 A1 | 10/2004 |
| WO | 2005/011329 A2 | 2/2005 |
| WO | 2009/071110 A1 | 6/2009 |
| WO | 2009/071111 A1 | 6/2009 |
| WO | 2009/099547 A2 | 8/2009 |
| WO | 2009/133495 A1 | 11/2009 |
| WO | 2011/037026 A1 | 3/2011 |

\* cited by examiner

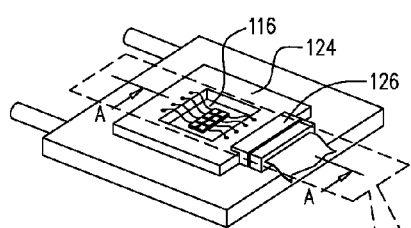
FIG. 2
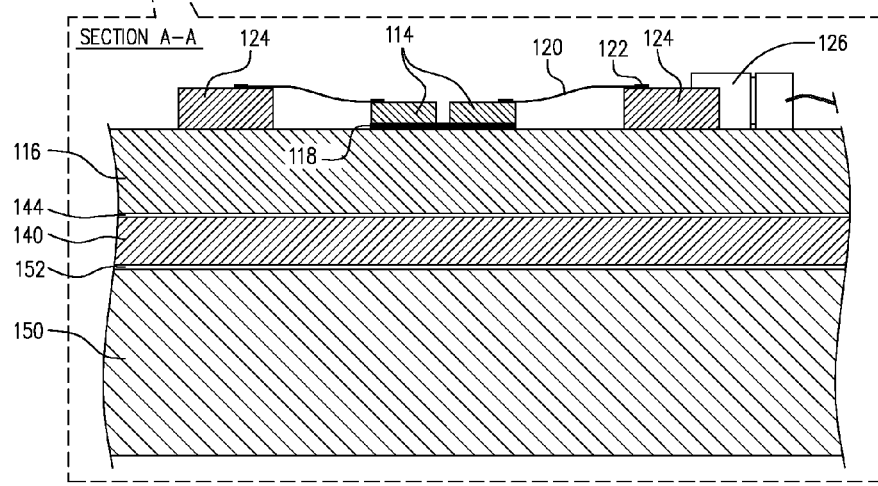

LIGHT ENGINE

FIELD OF THE INVENTION

The present invention relates to light sources generally and more particularly to LED-based light sources.

BACKGROUND OF THE INVENTION

Various types of light sources are known for various applications. Highly uniform, high power light sources are desirable for direct write applications.

SUMMARY OF THE INVENTION

The present invention seeks to provide a highly uniform LED-based light source.

There is thus provided in accordance with a preferred embodiment of the present invention an LED-based high power uniform light engine including an array of LEDs having a common anode and a fill factor which exceeds 0.85, the common anode having heat spreading functionality and an active heat sink which is thermally connected to the common anode.

Preferably, the LED-based high power uniform light engine also includes a heat spreader which is thermally connected between the common anode and the active heat sink. Additionally, the LED-based high power uniform light engine also includes an electrically and thermally conductive adhesive which joins the heat spreader to the common anode. Alternatively the LED-based high power uniform light engine also includes an electrically and thermally conductive solder material which joins the heat spreader to the common anode.

In accordance with a preferred embodiment of the present invention the array of LEDs is driven in a continuous mode of operation by a current greater than one ampere per square mm of the radiation area of the LEDs. Additionally, at least one of the common anode and the active heat sink has a cooling capacity of at least four watts per square mm of the radiation area of the LEDs.

Preferably, the array of LEDs is driven in a continuous mode of operation by a current greater than three amperes per square mm of the radiation area of the LEDs. Additionally, at least one of the common anode and the active heat sink has a cooling capacity of at least 12 watts per square mm of the radiation area of the LEDs.

In accordance with a preferred embodiment of the present invention the array of LEDs is driven in a continuous mode of operation by a current greater than six amperes per square mm of the radiation area of the LEDs. Additionally, at least one of the common anode and the active heat sink has a cooling capacity of at least 24 watts per square mm of the radiation area of the LEDs.

Preferably, the array of LEDs is driven in a continuous mode of operation by a current which is at least three times the rated current specified by the manufacturer of the LEDs. More preferably, the array of LEDs are driven in a continuous mode of operation by a current which is at least six times the rated current specified by the manufacturer of the LEDs. Most preferably, the array of LEDs are driven in a continuous mode of operation by a current which is at least 12 times the rated current specified by the manufacturer of the LEDs.

In accordance with a preferred embodiment of the present invention the array of LEDs is arranged to have a fill factor of at least 90%. More preferably, the array of LEDs is arranged to have a fill factor of at least 95%. Even more preferably, the array of LEDs is arranged to have a fill factor of 100%.

Preferably, at least one of the common anode and the active heat sink has a cooling capacity sufficient to dissipate sufficient heat from the array so as to maintain an LED junction temperature which does not exceed the maximum junction temperature specified by the manufacturer of the LEDs.

In accordance with a preferred embodiment of the present invention the array of LEDs includes a first plurality LEDs all formed on a single silicon substrate and operating within a first range of wavelengths. Additionally, the LED array also includes a second plurality of LEDs, all formed on a single silicon substrate and operating within a second range of wavelengths.

BRIEF DESCRIPTION OF THE DRAWINGS

The present invention will be understood and appreciated more fully from the following detailed description, taken in conjunction with the drawings in which:

FIG. 2 is a simplified side view and sectional illustration of a portion of the LED-based high power uniform light engine of FIG. 1, the sectional illustration taken along lines A-A in FIG. 2.

DETAILED DESCRIPTION OF A PREFERRED EMBODIMENT

Figure 1:
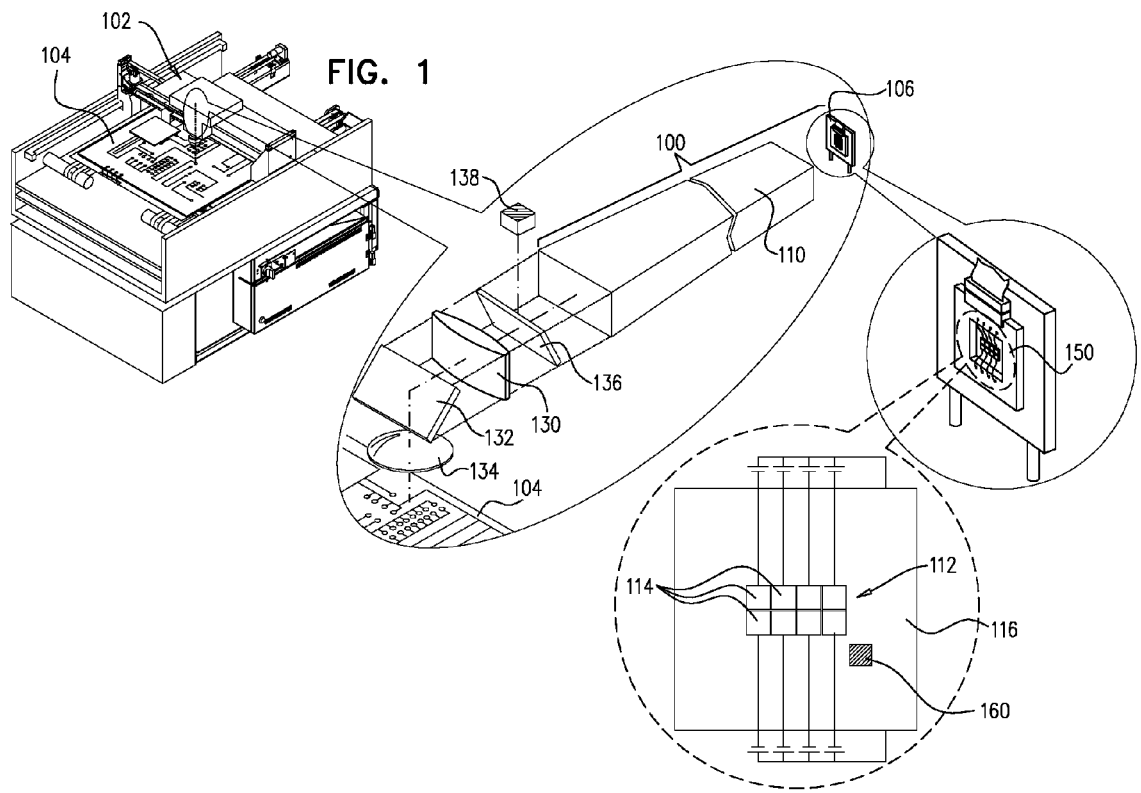
FIG. 1 is a simplified illustration of an LED-based high power uniform light engine in the context of a direct write system.

Reference is now made to FIG. 1, which is a simplified illustration of an LED-based high power uniform light engine in the context of a direct write system, and to FIG. 2, which is a simplified side view and sectional illustration of a portion of the LED-based high power uniform light engine of FIG. 1.

As seen in FIG. 1, there is provided an LED-based high power uniform light engine 100, shown installed in a scanning platform 102, mounted on a chassis, such as that used in Paragon™ line machine offered by Orbotech Ltd. Yavne, Israel, which chassis may provide up to three axis scanning relative to a substrate 104. The light engine 100 is preferably employed for direct writing on a photosensitive material, such as a solder mask or photoresist coated substrate or film.

In accordance with a preferred embodiment of the invention, the light engine 100 typically includes a LED array subsystem 106 and a homogenizing light guide 110, typically glass or another transparent material, such as plastic or quartz, having a typical output face of dimensions approximately 5×10 mm, which receives a light output from an LED-based high power uniform light source including an array 112 of LEDs 114 having a common anode 116. A preferred array 112 includes a total of eight LEDs 114 arranged in a 4×2 configuration.

As seen in FIG. 2, LEDs 114 and common anode 116 are typically joined by an electrically and thermally conductive adhesive 118. Alternatively LEDs 114 and common anode 116 can be joined by soldering such as soldering by eutectic solder.

As seen further in the illustrated embodiment of FIG. 2, a cathode of each of LEDs 114 is connected, typically via a conductor 120, such as a wire, to a pad 122 attached to an isolating substrate 124, typically made of PCB laminate material. Each pad 122 is connected via a conductor (not shown) to a different pin of a connector 126 which supplies power and controls each of individual LEDs 114.

Light engine 100 is also typically connected to suitable imaging/focusing optics, which receive an output beam of light from homogenizing light guide 110 and focus the beam onto the desired location on substrate 104. In the illustrated embodiment shown in FIG. 1, the imaging/focusing optics includes a first lens assembly 130, a spatial light modulator 132 which receives a highly spatially uniform beam of light, typically within a spectrum extending between 350 and 420 nm, from homogenizing light guide 110 and directs it via a second lens assembly 134 onto substrate 104. Additionally, a beam splitter 138 may be provided to direct a portion of the light onto an optical power meter 138 to monitor the optical power.

Light engine 100 may also include an additional lens set (not shown) located between LED array subsystem 106 and homogenizing light guide 110 to efficiently collect illuminated light from LED array subsystem 106 and direct it towards light guide 110.

It is a particular feature of the present invention that the array 112 of LEDs 114 has a fill factor, i.e. a ratio of LED surface area to total area of the array, which exceeds 0.85, more preferably exceeds 0.9 and even more preferably exceeds 0.95. In some embodiments the array of LEDs is arranged to have a fill factor of 100%. For example, in an array of 4 by 4 LEDS, where each LED measures 1×1 mm, and a distance between each of the LEDS is 50 microns, the fill factor will be $(4/4.15)^2$, or approximately 0.93.

It is a further particular feature of the present invention that the common anode 116 has heat spreading functionality. In the illustrated embodiment, the total area of the array 112 of LEDs 114 is approximately between 8 and 10 square mm and the total area of the common anode 116 is approximately 100 square mm.

In accordance with one embodiment of the present invention, seen in FIG. 2, an additional heat spreader 140 is provided in thermal contact with the common anode 116. In this embodiment, common anode 116 is preferably formed as a conductive layer coating additional heat spreader 140. Alternatively, as seen in the illustrated embodiment of FIG. 2, additional heat spreader 140 and common anode 116 are joined by a thermally conductive adhesive or solder 144.

An active heat sink 150 is preferably provided in thermal contact with the common anode 116, either directly or, as seen particularly in FIG. 2, via additional heat spreader 140. In the illustrated embodiment of FIG. 2, additional heat spreader 140 and active heat sink 150 are joined by a thermally conductive adhesive or solder 152. Alternatively, additional heat spreader 140 may be obviated and common anode 116 and active heat sink 150 may be joined by thermally conductive adhesive 152. Alternatively, common anode 116 may be formed as a conductive layer coating heat sink 150, thus obviating thermally conductive adhesive 152.

Preferably, the separation between adjacent LEDs 114 is less than 50 microns. More preferably, there is no separation whatsoever between adjacent LEDs 114.

In accordance with a preferred embodiment of the present invention the array 112 of LEDs 114 is driven in a continuous mode of operation by a current greater than one amperes per square mm of the radiation area of the LEDs 114. More preferably, the current is greater than three amperes per square mm of the radiation area of the LEDs 114. Even more preferably, the current is greater than six amperes per square mm of the radiation area of the LEDs 114.

In accordance with a preferred embodiment of the present invention the array 112 of LEDs 114 is driven in a continuous mode of operation by a current which is at least three times the rated current specified by the manufacturer of the LEDs 114. More preferably, the array 112 of LEDs 114 is driven in a continuous mode of operation by a current which is at least six times the rated current specified by the manufacturer of the LEDs 114. Most preferably, the array 112 of LEDs 114 is driven in a continuous mode of operation by a current which is at least 12 times the rated current specified by the manufacturer of the LEDs 114.

Preferably, a cooling capacity of at least 4 watts per square mm of the radiation area of the LEDs 114 is provided by at least one of common anode 116, with or without additional heat spreader 140, and active heat sink 150. More preferably, a cooling capacity of at least 12 watts per square mm of the radiation area of the LEDs 114 is provided by at least one of common anode 116, with or without additional heat spreader 140, and active heat sink 150. Most preferably, a cooling capacity of at least 24 watts per square mm of the radiation area of the LEDs 114 is provided by the common anode 116 with or without additional heat spreader 140 and active heat sink 150.

It is a particular feature of the present invention that a cooling capacity sufficient to dissipate sufficient heat from array 112 of LEDs 114 so as to maintain an LED junction temperature which does not exceed the maximum junction temperature specified by the manufacturer of the LEDs is provided by at least one of the common anode 116, with or without additional heat spreader 140, and active heat sink 150. In accordance with a preferred embodiment, LED junction temperature is monitored by a thermal sensor 160, such as a thermistor, located in the proximity of LED array 112.

In accordance with a preferred embodiment of the present invention array 112 of LEDs 114 includes a first plurality of LEDs 114 all formed on a single silicon substrate and operating within a first range of wavelengths, typically from 350-390 nm. Array 112 may also include a second plurality of LEDs 114, all formed on a single silicon substrate and operating within a second range of wavelengths, typically from 390-420 nm. It is appreciated that any suitable wavelength range may be used for array 112 of LEDs 114, and that each of the LEDs may operate in a different wavelength range.

Preferably, array 112 of LEDs 114 is commercially available from SEMILEDS Optoelectronics Co., Ltd., 3F, No. 11 Ke Jung Rd., Chu-Nan Site, Hsinchu Science Park, Chu-Nan 350, Miao-Li County, Taiwan, R. O. C or Cree, Inc., 4600 Silicon Dr., Durham, N.C., 27703.

It will be appreciated by persons skilled in the art that the present invention is not limited by what has been particularly shown and described hereinabove. Rather the scope of the present invention is defined by the claims which follow and include variations and modifications which would occur to persons skilled in the art upon reading the foregoing and which are not in the prior art.

The invention claimed is:

1. An LED-based high power uniform light engine comprising:
   an array of LEDs having a common anode and a fill factor (light emitting surface/total area) which exceeds 0.85, said common anode having heat spreading functionality; and
   an active heat sink which is thermally connected to said common anode.

2. An LED-based high power uniform light engine according to claim 1 and also comprising a heat spreader which is thermally connected between said common anode and said active heat sink.

3. An LED-based high power uniform light engine according to claim 2 and also comprising an electrically and thermally conductive adhesive which joins said heat spreader to said common anode.

4. An LED-based high power uniform light engine according to claim 2 and also comprising an electrically and thermally conductive solder material which joins said heat spreader to said common anode.

5. An LED-based high power uniform light engine according to claim 1 and wherein said array of LEDs is driven in a continuous mode of operation by a current greater than one ampere per square mm of the radiation area of the LEDs.

6. An LED-based high power uniform light engine according to claim 5 and wherein at least one of said common anode and said active heat sink has a cooling capacity of at least four watts per square mm of the radiation area of the LEDs.

7. An LED-based high power uniform light engine according to claim 1 and wherein said array of LEDs is driven in a continuous mode of operation by a current greater than three amperes per square mm of the radiation area of the LEDs.

8. An LED-based high power uniform light engine according to claim 7 and wherein at least one of said common anode and said active heat sink has a cooling capacity of at least 12 watts per square mm of the radiation area of the LEDs.

9. An LED-based high power uniform light engine according to claim 1 and wherein said array of LEDs is driven in a continuous mode of operation by a current greater than six amperes per square mm of the radiation area of the LEDs.

10. An LED-based high power uniform light engine according to claim 9 and wherein at least one of said common anode and said active heat sink has a cooling capacity of at least 24 watts per square mm of the radiation area of the LEDs.

11. An LED-based high power uniform light engine according to claim 1 and wherein said array of LEDs is driven in a continuous mode of operation by a current which is at least three times the rated current specified by the manufacturer of the LEDs.

12. An LED-based high power uniform light engine according to claim 1 and wherein said array of LEDs is driven in a continuous mode of operation by a current which is at least six times the rated current specified by the manufacturer of the LEDs.

13. An LED-based high power uniform light engine according to claim 1 and wherein said array of LEDs is driven in a continuous mode of operation by a current which is at least 12 times the rated current specified by the manufacturer of the LEDs.

14. An LED-based high power uniform light engine according to claim 1 and wherein said array of LEDs is arranged to have a fill factor of at least 90%.

15. An LED-based high power uniform light engine according to claim 1 and wherein said array of LEDs is arranged to have a fill factor of at least 95%.

16. An LED-based high power uniform light engine according to claim 1 and wherein at least one of said common anode and said active heat sink has a cooling capacity sufficient to dissipate sufficient heat from the array so as to maintain an LED junction temperature which does not exceed the maximum junction temperature specified by the manufacturer of the LEDs.

17. An LED-based high power uniform light engine according to claim 1 and wherein said array of LEDs includes a first plurality LEDs all formed on a single silicon substrate and operating within a first range of wavelengths.

18. An LED-based high power uniform light engine according to claim 16 and wherein said LED array also comprises a second plurality of LEDs, all formed on a single silicon substrate and operating within a second range of wavelengths.

19. An LED-based high power uniform light engine according to claim 2 and wherein said array of LEDs is driven in a continuous mode of operation by a current greater than one ampere per square mm of the radiation area of the LEDs.

20. An LED-based high power uniform light engine according to claim 2 and wherein said array of LEDs is driven in a continuous mode of operation by a current greater than six amperes per square mm of the radiation area of the LEDs.

21. An LED-based high power uniform light engine according to claim 2 and wherein said array of LEDs is driven in a continuous mode of operation by a current which is at least three times the rated current specified by the manufacturer of the LEDs.

* * * * *